(12) United States Patent
Neyts et al.

(10) Patent No.: US 11,796,727 B2
(45) Date of Patent: Oct. 24, 2023

(54) NANOSTRUCTURED SHAPES HAVING ANISOTROPIC ABSORPTION AND EMISSION

(71) Applicant: Universiteit Gent, Ghent (BE)

(72) Inventors: Kristiaan Neyts, Ghent (BE); Yerzhan Ussembayev, Ghent (BE)

(73) Assignee: Universiteit Gent, Ghent (BE)

( * ) Notice: Subject to any disclaimer, the term of this patent is extended or adjusted under 35 U.S.C. 154(b) by 507 days.

(21) Appl. No.: 17/251,672

(22) PCT Filed: Jun. 17, 2019

(86) PCT No.: PCT/EP2019/065914
§ 371 (c)(1),
(2) Date: Dec. 11, 2020

(87) PCT Pub. No.: WO2019/243275
PCT Pub. Date: Dec. 26, 2019

(65) Prior Publication Data
US 2021/0249546 A1    Aug. 12, 2021

(30) Foreign Application Priority Data
Jun. 18, 2018 (EP) .................................... 18178194

(51) Int. Cl.
*G02B 5/30* (2006.01)
*C09K 11/88* (2006.01)
(Continued)

(52) U.S. Cl.
CPC .......... *G02B 5/3025* (2013.01); *C09K 11/883* (2013.01); *G02F 1/133528* (2013.01);
(Continued)

(58) Field of Classification Search
CPC ....... H01L 31/035227; G02B 2207/101; G02F 1/017
See application file for complete search history.

(56) References Cited

U.S. PATENT DOCUMENTS

| 2011/0069724 A1* | 3/2011 | Richard ................ G02F 1/3534 |
| | | 359/341.1 |
| 2014/0312302 A1* | 10/2014 | Oron ...................... C09K 11/54 |
| | | 257/14 |

(Continued)

FOREIGN PATENT DOCUMENTS

WO    2017/186642 A1    11/2017

OTHER PUBLICATIONS

European Communication pursuant to Article 94(3) EPC for European Application No. 19731966, dated Dec. 1, 2021, 5 pages.
(Continued)

*Primary Examiner* — Paul C Lee
(74) *Attorney, Agent, or Firm* — TraskBritt

(57) ABSTRACT

Nanostructured shapes comprising at least a first part and a second part. The first part has a longitudinal axis L and comprises a first absorbing material and an emitting material. The second part is connected to the first part and comprises a second absorbing material. The second part mainly absorbs light with direction of polarization other than the long axis L of the first part, and the nanostructured shape emits light mainly polarized along the long axis L of the first
(Continued)

part. The disclosure further relates to an assembly of nanostructured shapes, to a method of synthesizing nanostructured shapes and to a polarizing light emitting plate comprising such nanostructured shapes.

16 Claims, 8 Drawing Sheets

(51) Int. Cl.
    *G02F 1/1335*     (2006.01)
    *H01L 31/0296*     (2006.01)
    *H01L 31/0352*     (2006.01)
    *H01L 31/055*     (2014.01)
    *H01L 31/18*     (2006.01)
    *B82Y 20/00*     (2011.01)
    *B82Y 40/00*     (2011.01)

(52) U.S. Cl.
    CPC .. *H01L 31/0296* (2013.01); *H01L 31/035227* (2013.01); *H01L 31/055* (2013.01); *H01L 31/1828* (2013.01); *B82Y 20/00* (2013.01); *B82Y 40/00* (2013.01); *G02B 2207/101* (2013.01); *G02F 2202/36* (2013.01)

(56) References Cited

U.S. PATENT DOCUMENTS

2016/0216588 A1*   7/2016   Ah .......................... G02F 1/15
2017/0023803 A1*   1/2017   Han ....................... G02F 1/015
2017/0322451 A1*  11/2017   Kang ............... G02F 1/133606
2017/0357119 A1*  12/2017   Kim .................... G02B 5/3033

OTHER PUBLICATIONS

International Search Report for International Application No. PCT/EP2019/065914, dated Aug. 6, 2019, 4 pages.
International Written Opinion for International Application No. PCT/EP2019/065914, dated Aug. 6, 2019, 6 pages.
Mishra et al. "Unusual Selectivity of Metal Deposition on Tapered Semiconductor Nanostructures" Chemistry of Materials, vol. 24, No. 11, May 21, 2012 (May 21, 2012), p. 2040-2046, XP055520682.
Vasiliev et al, "Facet-selective growth and optical properties of CdTe/CdSe tetrapod-shaped nanocrystal heterostructures", Journal of Materials Research, vol. 26, No. 13, Jul. 1, 2011 (Jul. 11, 2011), p. 1621-1626, XP055520665.

* cited by examiner

NANOSTRUCTURED SHAPES HAVING ANISOTROPIC ABSORPTION AND EMISSION

CROSS-REFERENCE TO RELATED APPLICATIONS

This application is a national phase entry under 35 U.S.C. § 371 of International Patent Application PCT/EP2019/065914, filed Jun. 17, 2019, designating the United States of America and published as International Patent Publication WO 2019/243275 A1 on Dec. 26, 2019, which claims the benefit under Article 8 of the Patent Cooperation Treaty to European Patent Application Serial No. 18178194.9, filed Jun. 18, 2018.

TECHNICAL FIELD

This disclosure relates to a nanostructured shape and to an assembly of nanostructured shapes. The disclosure further relates to a method of synthesizing such nanostructured shapes. Furthermore, the disclosure relates to a polarizing light emitting plate comprising at least one nanostructured shape or at least one assembly of nanostructured shapes.

BACKGROUND

Quantum dots, embedded in semiconductor nanoparticles with a higher bandgap, can provide efficient photoluminescence. For particles dispersed in a medium with lower refractive index, the dielectric effect strongly affects the absorption and emission of light. The absorption and the emission of such quantum dots remain however mainly isotropic.

Quantum dots in rods, as, for example, CdSe dots in a CdS shell (or in a CdS rod), allow to attain high quantum efficiencies. Because of the anisotropic shape of the rod and because of the high dielectric constant, external electric fields perpendicular to the long axis of the rod are internally reduced more than electric fields along the long axis of the rod. Consequently, light polarized along the long axis of a quantum rod will be absorbed more effectively in the CdS rod than light polarized perpendicular to the long axis of the CdS rod. The light absorption of quantum dots in rods is therefore anisotropic. Similarly, the emission of a CdSe quantum dot surrounded by an anisotropic shell of CdS is strongly anisotropic. The emission is mainly polarized in the plane that contains the long axis of the rod.

Aligning individual dots in rods in a particular direction make such dots in rods attractive for a number of applications as aligned dots in rods emit polarized light. Such applications comprise, for example, back light units of liquid crystal displays and optical sensors. Although the absorption as well as the emission of dots in rods is anisotropic, the anisotropy of the absorption and the emission is the same.

Some fluorescent or phosphorescent organic dyes can absorb and emit light anisotropically. However, such dyes molecules have narrow absorption bands and the anisotropy of the emission of such dyes is usually small. Furthermore the life time of such dye molecules is limited.

BRIEF SUMMARY

Provided herein are nanostructured shapes allowing efficient transfer of electrons and holes from one semiconductor material to an emitting material, in particular a quantum dot, having a high quantum efficiency.

Provided herein are nanostructured shapes, in particular nanoparticles, having a different anisotropy for absorption and emission of light.

Provided herein are nanostructured shapes that absorb unpolarised light and emit linearly polarised light.

Provided herein are nanostructured shapes that absorb incident light from a certain direction or from certain directions and emit light mainly into another direction.

Provided is an assembly of aligned nanostructured particles.

Provided is a liquid crystal display (LCD) backlight able to transform unpolarised light, for example blue light from a light emitting diode (LED), into polarized light, for example, red and/or green light polarized parallel to the polarizer of the LCD.

Provided is a luminescent solar concentrator able to transform unpolarised light from the sun into light that is mainly guided in the waveguide material by total internal reflection.

According to a first aspect of the disclosure, nanostructured shapes are provided. A nanostructured shape according to the disclosure comprises at least a first part and a second part. The first part has an elongated shape with a long axis L and a short axis S (with the long axis L perpendicular to the short axis S), a length l measured along the long axis L and a width w measured along the short axis S. The length l is thereby larger than the width w and the length l is smaller than 1 µm. The first part has a first longitudinal end and a second longitudinal end. The first part comprises a first absorbing material and an emitting material. The emitting material is surrounded by the first absorbing material. The emitting material can thereby be referred to as the core, whereas the first absorbing material can be referred to as the shell. Preferably, the emitting material is completely surrounded by the first absorbing material. In some embodiments, the emitting material is substantially surrounded by the first absorbing material. With "substantially surrounded" is meant that although not the full surface area of the emitting material is covered with the first absorbing material, the major part, for example, at least 80% of the surface area of the emitting material or at least 90% of the surface area of the emitting material is covered with the first absorbing material.

The second part comprises a second absorbing material.

Each of the emitting material, the first absorbing material and the second absorbing material comprise a semiconductor material having a bandgap, with the bandgap of the first absorbing material being larger than the bandgap of the emitting material and with the bandgap of the second absorbing material being at least as large as the bandgap of the first absorbing material. For the purpose of this invention, the term "bandgap" refers to "semiconductor bandgap."

The second part is connected to the first part in a first connection region. Preferably, the second part of the nanostructured shape is connected to the first longitudinal end of the first part.

The second part of the nanostructured shape mainly absorbs light with a direction of polarization other than the long axis L of the first part of the nanostructured shape or mainly absorbs light in a combination of directions of polarization, each of the directions of polarization being different from the long axis L of the first part.

The nanostructured shape according to the disclosure, in particular, the first part of the nanostructured shape emits light mainly polarized along the long axis L of the first part.

Preferably, the second part of the nanostructured shape is not comprising an emitting material.

Nanostructured particles according to the disclosure have the advantage that their absorption and emission is anisotropic. The shape of the first part and the shape of the second part have a strong influence on the anisotropy between the absorption and the emission of the nanostructured shape. Also the position of the emitting material can have a strong influence on the difference in anisotropy between the absorption and the emission of the nanostructured shape.

As used herein, the terms "long axis" and "longitudinal axis" can be used interchangeably. Similarly, the term "short axis" and "transversal axis" can be used interchangeably.

As used herein, the wording "mainly absorbs light with a direction of polarization other than the long axis L" means that light polarized in another direction than the long axis L is absorbed 1.5 times more, preferably 2 times more or 5 times more than light polarized along the long axis L. The wording "mainly absorbs light in a combination of directions of polarization, each of the directions of polarization being different from the long axis L of the first part" means that light polarized in a combination of directions other than the long axis L is absorbed 1.5 times more, preferably 2 times more or 5 times more than light polarized along the long axis L, i.e., that the sum of the light polarized in the directions other than the long axis L is absorbed 1.5 times more, preferably 2 times more or 5 times more than the light polarized along the long axis L.

As specified above, a second part of a nanostructured shape according to the disclosure is mainly absorbing light with a direction of polarization other than the long axis L of the first part of the nanostructured shape. This means that a second part of a nanostructured shape according to the disclosure absorbs light polarized in another direction than the long axis L 1.5 times more, preferably 2 times more or 5 times more than light polarized along the long axis L.

An example comprises a nanostructured shape having a first part with a long axis L oriented along the z-direction and a second part absorbing light polarized in another direction than the long axis L, for example, in the x-direction or in the y-direction, 1.5 times, 2 times or 5 times more that light polarized along the long axis L.

Alternatively, a second part of a nanostructured shape according to the disclosure mainly absorbs light in a combination of directions of polarization, each of the directions of polarization being different from the long axis L of the first part. This means that a second part of a nanostructured shape according to the disclosure absorbs light polarized in a combination of directions other than the long axis L 1.5 times more, preferably 2 times more or 5 times more than light polarized along the long axis L.

An example comprises a nanostructured shape having a first part with a long axis L oriented along the z-direction and a second part absorbing light in a combination of directions other than the long axis L, for example, in a combination of the x-direction and the y-direction 1.5 times more, preferably 2 times more or 5 times more than light polarized along the long axis L.

For the purpose of this invention the wording "emits light mainly polarized along the long axis L" means that more than 50% of the emitted light is polarized along the long axis L, more preferably more than 60%, more than 70%, more than 80% or more than 90% of the emitted light is polarized along the long axis L.

For a nanostructure shape according to the disclosure, at least 50% of the emitted light is polarized along the long axis L. More preferably, at least 60%, at least 70%, at least 80% or at least 90% of a nanostructured shaped according to the disclosure is polarized along the long axis L.

An example comprises a nanostructured shape having a first part with a long axis L oriented along the z-direction whereby at least 50%, at least 60%, at least 70%, at least 80% or at least 90% of the emitted light is polarized along the z-direction.

When in embodiments and/or in claims of the disclosure reference is made to nanostructured shapes, the term nanostructured shapes refers to bodies comprising at least a first part and a second part whereby at least one part, preferably the first part, comprises a nanoparticle. The term nanoparticle is not limited to any particular shape but refers to any particle having one or more dimensions being 1 μm or less. In some embodiments of the disclosure, all dimensions of a nanoparticle may be 1 μm or less. In particular, embodiments of the disclosure and all dimensions of a nanostructured shape may be 1 μm or less. In such cases, the nanostructured shape can be considered as a nanoparticle.

The emitting material is preferably positioned along the long axis L of the first part at a distance D from the first connection region. The distance D is measured along the long axis L of the first part, from the center point (center of gravity) of the emitting material to the first connection region. The distance D is preferably not zero. More preferably, the distance D between the emitting material and the first connection region ranges between the width w of the first part and the length l of the first part minus the width w of the first part, i.e., between w and l-w.

In preferred embodiments, the distance D ranges between 2.w and l-2.w or between 3.w and l-3.w.

The distance D may have a strong influence on difference in anisotropy between the absorption and the emission of the nanostructured shape.

As mentioned above the first part of a nanostructured shape according to the disclosure has a length l and a width w, with the length l being larger than the width w. In preferred embodiments, the length l is at least two times the width w. In more preferred embodiments, the length l ranges between 5 times the width w and 10 times the width w.

The length l is preferably smaller than 1 μm. More preferably, the length l ranges between 1 and 100 nm or between 5 and 60 nm and is, for example, equal to 10 nm, 20 nm, 30 nm, 40 nm or 50 nm.

The dimensions of the emitting material are preferably in the range between 1 and 10 nm.

In case the length of the first part of a nanostructured shape is not constant, i.e., in case the length varies over the width of the first part, the length l refers to the maximum length of the first part measured along the long axis L. Similarly, in case the width w of the first part is not constant, i.e., in case the width varies over the length of the first part, the width w refers to the maximum width of the first part measured along the short axis S.

Any shape having a long axis defining a length l and a short axis defining a width w whereby the length l is larger than the width w can be considered as elongated shape. Any such elongated shape can be considered as the first part of the nanostructured shape of the disclosure.

Preferred elongated shapes of the first part comprise rod or rod-like structures. Rod or rod-like structures comprise, for example, cylinder shapes with a long axis (longitudinal axis) defining a length l and a short axis (transversal axis) defining a diameter or width w. Other rod or rod-like structures comprise prism shapes.

The cross-section of the first part may have any shape. The cross-section may, for example, be circular, elliptical or polygonal such as rectangular, square, pentagonal, hexagonal or octagonal. A preferred cross-section comprises a circular cross-section.

The area of the cross-section of the first part may be invariant over the length l of the first part or may vary over the length l of the first part. The area of the cross-section may, for example, be large at the middle of the first part and decrease toward to the longitudinal ends of the first part.

The rod or rod-like structures may have parallel or substantial parallel longitudinal ends or may have non-parallel longitudinal ends as, for example, hemispherical longitudinal ends, conical longitudinal ends or pyramidal longitudinal ends.

The first absorbing material and the second absorbing material may comprise any semiconductor material known in the art. Preferred materials of the first absorbing material and of the second absorbing material comprise a II-VI, III-V, III-VI, VI-IV, or IV group semiconductor material or a compound thereof. Alternatively, the first absorbing material may comprise an organic semiconductor material.

Examples of II-VI group material include CdSe, CdS, CdTe, ZnO, ZnSe, ZnTe, HgSe, HgTe, CdZnSe or a compound thereof.

Examples of III-V group materials comprise, for example, InP, InN, GaN, InSb, InAsP, InGaAs, GaAs, GaP, GaSb, AlP, AlN, AlAs, AlSb or a compound thereof.

Examples of VI-IV group materials comprise PbSe, PbTe, PbS, PbSnTe or a compound thereof.

Examples of IV group materials comprise C, Si, Ge, Sn and compounds thereof. Preferred material as the first absorbing material and as the second absorbing material comprises CdS and ZnS.

Examples of organic semiconductor materials comprise materials for which light absorption leads to the generation of an exciton, excitons can be transported and lead to fluorescence or phosphorescence when reaching dopant molecules.

The emitting material preferably comprises an organic or inorganic dipole emitter or a quantum dot. Preferred quantum dots comprise II-VI, III-V, III-VI, VI-IV, or IV group semiconductor material or a compound thereof.

In preferred embodiments, the first part of a nanostructured shape according to the disclosure comprises CdSe as emitting material and CdS as first absorbing material and as second absorbing material. In a further preferred embodiment, the emitting material comprises CdSe and the first absorbing material and the second absorbing material comprises ZnS.

The first absorbing material and the second absorbing material of a nanostructured shape according to the disclosure may comprise the same material or may comprise materials with the same or substantially the same bandgap. Preferably, the first absorbing material and the second absorbing material comprise the same material having the same bandgap.

Alternatively, the first absorbing material and the second material do not comprise the same material. The second absorbing material has a bandgap that is at least as large as the bandgap of the first absorbing material of the first part.

The second part of the nanostructured shape according to the disclosure may comprise many different shapes. Any shape allowing that light is mainly absorbed in a direction of polarization other than the long axis L of the first part or allowing that light is mainly absorbed in a combination of directions of polarization, each of the directions of polarization being different from the long axis L of the first part, can be considered.

A first group of nanostructured shapes according to the disclosure comprises elongated shapes as second parts. Such elongated shapes can also be referred to as unidirectional or one-dimensional shapes. The elongated shape has a long axis M and a short axis N (with the long axis M perpendicular to the short axis N), a length m measured along the long axis M, a width n measured along the short axis N, with the length m being larger than the width n. The second part is oriented with respect to the first part so that the long axis M of the second part defines an included angle α with the long axis L of the first part, the included angle α is thereby ranging between 60 and 120 degrees. More preferably the included angle α ranges between 80 and 100 degrees, between 85 and 95 degrees as, for example, 90 degrees.

Any shape having a long axis M defining a length m and a short axis N defining a width n whereby the length m is larger than the width n can be considered as elongated shape of the second part of the nanostructured shape.

In preferred embodiments, the length m is at least two times the width n. In more preferred embodiments, the length m ranges between 5 times the width n and 10 times the width n.

The length m is preferably smaller than 1 μm. More preferably, the length l is ranging between 1 and 100 nm or between 5 and 600 nm and is, for example, equal to 10 nm, 20 nm, 30 nm, 40 nm or 50 nm.

Preferred elongated shapes of the second part comprise rod or rod-like structures. Rod or rod-like structures comprise, for example, cylinder shapes with a long axis M (longitudinal axis) defining a length m and a short axis N (transversal axis) defining a diameter or width n. Other rod or rod-like structures comprise prism shapes.

The cross-section (transversal cross-section) of the second part may have any shape. The cross-section may, for example, be circular, elliptical or polygonal such as rectangular, square, pentagonal, hexagonal or octagonal. A preferred cross-section comprises a circular cross-section.

The area of the cross-section of the second part may be invariant over the length m of the second part or may vary over the length n of the second part. The area of the cross-section may, for example, be large at the middle of the second part and decrease toward to the longitudinal ends of the second part.

The rod or rod-like structures may have substantial parallel ends or non-parallel longitudinal ends, for example, hemispherical longitudinal ends, conical longitudinal ends or pyramidal longitudinal ends.

Examples of nanostructured shapes of the first group comprise L-shaped or T-shaped particles. In case of L-shaped particles, the second part of the nanostructured shape is connected with one of its longitudinal ends to a longitudinal end of the first part, i.e., to the first longitudinal end of the first part. In case of T-shaped particles, the second part of the nanostructured shape is connected with its longitudinal side to a longitudinal end of the first part, i.e., to the first longitudinal end of the first part.

A second group of nanostructured shapes according to the disclosure comprises as second part a two dimensional (non-unidirectional) shape whereby the second part and the long axis L of the first part are situated in a plane P. Examples of such second parts comprise multi-leg structures and platelet or tile shaped structures.

Preferred examples comprise second parts having two legs resulting in Y-shaped nanostructured shapes, second parts having three legs resulting in X-shaped nanostructured shapes and second parts comprising a ring-shaped structure resulting in nanostructured shapes whereby the first part is connected to this ring-shaped structure thereby forming, for example, the diameter of this ring. Other preferred examples comprise second parts having a tile shaped structures as, for example, a tile shaped structure having a circular or polygonal cross-section, for example, a rectangular, square, pentagonal or hexagonal cross-section.

A third group of nanostructured shapes according to the disclosure comprises as second part a planar or substantially planar structure, with the planar or substantially planar structure oriented in a plane S, whereby the plane S of the second part and the long axis L of the first part define an included angle β, with the included angle β being defined as the angle between the long axis L of the first part and the projection of the long axis L on the plane S. It is clear for a person skilled in the art that in case the projection of the long axis L on the plane S corresponds with a point, the included angle β is 90 degrees. The angle β ranges preferably between 50 and 130 degrees as, for example, between 60 and 120 degrees or between 80 and 100 degrees. More preferably, the angle β ranges between 85 and 95 degrees and is, for example, 90 degrees.

As planar structure any structure having a height that is lower than the width of the structure can be considered. Once the second part is connected with the first part the height of the planar structure is preferably oriented in the direction of the long axis L of the first part. Examples comprise planar structures as, for example, platelet shaped or tile shaped structures. Preferred examples comprise tile shaped structures with a circular or polygonal cross-section, for example, a square, pentagonal or hexagonal cross-section. The opposed surfaces of the planar structure can be parallel or non-parallel. In case the opposed surfaces are non-parallel one or both opposed surfaces may be conical or pyramidal.

Preferred examples of nanostructured shapes of the third group comprises thumbtack-shaped particles.

A fourth group of nanostructured shapes according to the disclosure comprises as second part a three-dimensional structure. Examples of three-dimensional structures comprise spheres, ellipsoids, and multi-leg structures, for example, multi-leg structures comprising at least 3 legs A preferred nanostructured shape comprises shapes having a multi-leg structure as second part whereby the different legs of the multi-leg structure are connected in a connection region and this connection region is connected to the first longitudinal end of the first part.

A further preferred nanostructured shape comprises a sphere as second part connected to the first longitudinal end of the first part.

In preferred embodiments, a nanostructured shape according to the disclosure further comprises a third part. The third part comprises a third absorbing material. Preferably, the third part is not comprising an emitting material.

Preferred nanostructured shapes comprising a first part, a second part and a third part comprise shapes whereby the second part is connected to the first part at a first longitudinal end of the first part and the third part is connected at the second longitudinal end of the first part.

The shape of the third part and the shape of the second part can be chosen independently from each other. In preferred embodiments, the third part and the second part have the same or substantially the same shape. In preferred embodiments, the third part and the second part are oriented in the same or substantially the same way to the long axis L of the first part.

The third absorbing material has a bandgap that is preferably larger than the bandgap of the emitting material. The bandgap of the third absorbing material is preferably at least as large as the bandgap of the first absorbing material of the first part.

Preferably, the third absorbing material and the second absorbing material may comprise the same material or may comprise materials with the same or substantially the same bandgap. Preferably, the third absorbing material and the second absorbing material comprise the same material having the same bandgap.

Alternatively, the third absorbing material and the second absorbing material do not comprise the same material.

In some embodiments, the first absorbing material, the second absorbing material and the third absorbing material comprise the same material or material with the same or substantially the same bandgap.

In particular embodiments of nanostructured shapes according to the disclosure, the nanostructured shapes comprise a plurality of n first parts, preferably aligned in a predetermined direction with their long axis L oriented parallel or substantially parallel. The first parts are preferably separated from each other, i.e., the first parts are preferably not contacting each other. The number n is in principle not limited. In a preferred embodiment, the nanostructured shape comprises a plurality of n first parts, one second part and one third part. The plurality of n first parts are aligned in a predetermined direction so that the long axes of the first parts are oriented parallel or substantially parallel. The first parts are preferably separated from each other, i.e., the first parts are preferably not contacting each other. The second part is connected to the first longitudinal ends of the parallel or substantially parallel oriented first parts and if the third part is connected to the second longitudinal ends of the parallel or substantially parallel oriented first parts. The second part and the third part are preferably oriented parallel or substantially parallel. The length of the second part and third part are preferably smaller than 1 µm. More preferably, the length of the second part and third part is ranging between 1 and 100 nm or between 5 and 600 nm and is, for example equal to 10 nm, 20 nm, 30 nm, 40 nm or 50 nm.

According to a second aspect of the disclosure, an assembly of nanostructured shapes is provided. The assembly comprises a plurality of nanostructured shapes as described above. The nanostructured shapes are aligned with the long axis L of the first part of the nanostructured shapes aligned in a predetermined direction. The long axes L of the first parts of the nanostructured shapes are thereby preferably oriented parallel or substantially parallel.

An assembly comprises preferably between 1 and $10^7$ nanostructured shapes per $mm^2$ and more preferably between $10^4$ and $10^6$ nanostructured shapes per $mm^2$, as, for example, $10^5$ nanostructured shapes per $mm^2$.

The nanostructures shapes can be aligned in a predetermined direction by any technique known in the art as, for example, by applying an external electric field (AC or DC), by hydrodynamic flow alignment or by liquid crystal(s).

The nanostructured shapes of an assembly may have the same shape and/or may comprise the same material(s). Alternatively, an assembly of nanostructured shapes comprise different types of nanostructured shapes as, for example, different shapes and/or different material(s). Preferably, an assembly comprises nanostructured shapes comprising the same shape and the same material(s).

The nanostructured shapes can be embedded in a material, for example, in a polymer material or can be connected or attached to a substrate, for example, a polymer substrate.

According to a third aspect of the disclosure, a method for synthesizing nanostructured shapes as described above are provided.

A preferred method for synthesizing nanostructured shapes comprises the following steps
- providing at least one first part comprising a first absorbing material and an emitting material, the emitting material being surrounded by the first absorbing material;
- providing a second part comprising a second absorbing material;
- joining the second part to the first part.

The at least one first part preferably has an elongated shape with a long axis L and a short axis S, a length l measured along the long axis L, a width w measured along the short axis S, with the length l being larger than the width w and with the length l being smaller than 1 µm. The first part has a first longitudinal end and a second longitudinal end.

Each of the emitting material(s), the first absorbing material and the second absorbing material comprise a semiconductor material having a bandgap, with the bandgap of the first absorbing material being larger than the bandgap of the emitting material and with the bandgap of the second absorbing material being at least as large as the bandgap of the first absorbing material.

Any shape described above can be considered as first part or as second part.

The first part and/or the second part can be synthesized according to methods known in the art. Complex shapes can, for example, be synthesized following synthesis methods as, for example, described in Nature, volume 430, p. 190-195; Nature, volume 548, p. 434-437 or Nature, volume 561, p. 378-382.

The second part is preferably joined to the first part by attraction of an electric field. Preferably, the second part is joined to the first longitudinal end of the first part.

Preferably, the shapes of the first part and of the second part and the way the first part and the second part are joined are chosen in such a way that the nanostructured shapes, in particular, the second part of the nanostructured shapes, mainly absorb light with direction of polarization other than the long axis L or mainly absorb light in a combination of directions of polarization, each of these directions being different from the long axis L and that the nanostructured shape emits light mainly polarized along the long axis L of the first part.

If a nanostructured shape according to the disclosure comprises a third part, the method for synthesizing such nanostructured shapes may comprises the following steps:
- providing at least one first part comprising a first absorbing material and an emitting material, the emitting material being surrounded by the first absorbing material;
- providing a second part comprising a second absorbing material;
- providing a third part comprising a third absorbing material;
- joining the second part to the first part; preferably joining the second part to the first longitudinal end of the first part; and
- joining the third part to the first part; preferably joining the third part to the second longitudinal end of the first part.

Preferably, the first and second parts are joined by attraction of an electric field. Similarly, the first and third part are preferably joined by attraction of an electric field.

Preferably, the shapes of the first part, the second part and the third part and the way the first part, the second part and the third part are joined, are chosen in such a way that the nanostructured shapes, in particular, the second part and/or the third part of the nanostructured shapes mainly absorb light with direction of polarization other than the long axis L or mainly absorb light in a combination of directions of polarization, each of these directions being different from the long axis L and that the nanostructured shape emits light mainly polarized along the long axis L of the first part.

The third part may have the same shape as the second part and/or may comprise the same material as the second part. Alternatively, the second part and the third part have a different shape and/or comprise a different material.

In a preferred way the second part is joined to the first longitudinal end of the first part and the third part is joined to the second longitudinal end of the first part.

In case the nanostructured shape comprises more than one first part, the first parts are preferably aligned before the second part and/or the third part is/are joined to the first parts. The first parts can, for example, be aligned by applying an electric field. Possibly, the aligned first parts are embedded in a matrix material, for example, a polymer matrix material, that can be selectively etched away (partially or fully) for example, once the second and/or third part is/are joined.

An alternative method for synthesizing nanostructured shapes as described above comprises the steps of
- providing at least one first part comprising a first absorbing material and an emitting material, the emitting material being surrounded by the first absorbing material;
- depositing or growing a second part comprising a second absorbing material on or to the first part, preferably on or to a first longitudinal end of the first part.

The first part preferably has an elongated shape with a long axis L and a short axis S, a length l measured along the long axis L, a width w measured along the short axis S, with the length l being larger than the width w and with the length l being smaller than 1 µm. The first part has a first longitudinal end and a second longitudinal end.

Each of the emitting material(s), the first absorbing material and the second absorbing material comprise a semiconductor material having a bandgap, with the bandgap of the first absorbing material being larger than the bandgap of the emitting material and with the bandgap of the second absorbing material being at least as large as the bandgap of the first absorbing material.

As first and second part any shape described above can be considered.

The first part can be synthesized according to methods known in the art. The second part can be deposited or grown on the first part by using methods known in the art. In case the first part, the second part or the growing or deposition of the second part on the first part involves the synthesis of complex shapes, methods as described in Nature, volume 430, p. 190-195; Nature, volume 548, p. 434-437 or Nature, volume 561, p. 378-382 can be considered.

Preferably, the shape of the first part and/or the shape of the second part and the way the second part is deposited or grown on the first part is chosen in such a way to allow that the nanostructured shape, in particular, the second part of the nanostructured shapes, mainly absorbs light with direction of polarization other than the long axis L or mainly absorbs light in a combination of directions of polarization, each of these directions being different from the long axis L and that the nanostructured shape emits light mainly polarized along the long axis L of the first part.

If a nanostructured shape according to the present comprises a third part, the method for synthesizing such nanostructured shapes may comprise the following steps:
- providing at least one first part comprising a first absorbing material and an emitting material, the emitting material being surrounded by the first absorbing material;
- depositing or growing a second part comprising a second absorbing material on the first part, preferably on or to a first longitudinal end of the first part;
- depositing or growing a third part comprising a third absorbing material on the first part, preferably on a second longitudinal end of the first part.

Preferably, the shapes of the first part, the second part and the third part and the way the first part, the second part and the third part are deposed or grown on the first part are chosen in such a way that the nanostructured shapes, in particular, the second part and/or the third part of the nanostructured shapes mainly absorb light with direction of polarization other than the long axis L or mainly absorb light in a combination of directions of polarization, each of these directions being different from the long axis L and that the nanostructured shape emits light mainly polarized along the long axis L of the first part.

The third part may have the same shape as the second part and/or may comprise the same material as the second part. Alternatively, the second part and the third part have a different shape and/or comprise a different material.

In case the nanostructure shape comprises more than one first part, the first parts are preferably aligned before the second part and/or the third part is/are deposited or grown on the first parts. The first parts can, for example, be aligned by applying an electric field. Possibly, the aligned first parts are embedded in a matrix material, for example, a polymer matrix material. The matrix material can then be selectively etched away (partially or fully) before or after the deposition or growth of the second and/or third part.

According to a fourth aspect of the disclosure, a polarizing light emitting plate comprising at least one assembly of nanostructured shapes as described above is provided. The at least one assembly of nanostructured shapes are preferably embedded in a matrix or connected to a substrate. The nanostructured shapes are, for example, embedded in a polymer matrix or connected to a polymer substrate. The polarized light emitting plate has a desired direction of light emission. The long axes L of the first parts of the nanostructured shapes are oriented parallel or substantially parallel to the desired direction of light emission.

An assembly may comprise one type of nanostructured shapes comprising the same material(s) and having the same shape. Alternatively, an assembly may comprise different types of nanostructured shapes, for example, nanostructured shapes comprising different material(s) and/or having different shapes.

According to a fifth aspect of the disclosure, a liquid crystal display device is provided.

The liquid crystal display device comprises
- a backlight unit;
- a liquid crystal display panel disposed above the backlight unit;
- a polarizing light emitting plate as described above, disposed between the backlight unit and the liquid crystal display panel; and
- a polarizer having a transmission direction. The polarizer is disposed between the polarizing light emitting plate and the liquid crystal display panel or attached to the liquid crystal display panel.

wherein the long axis L of the first parts of the nanostructured shapes of the assembly of nanostructured shapes are oriented parallel or substantially parallel with the transmission direction of the polarizer.

Any nanostructured shape described above can be used for the polarizing light emitting plate of the liquid crystal display. An assembly may comprise one type of nanostructured shapes comprising the same material(s) and having the same shape. Also assemblies comprising different types of nanostructured shapes as, for example, nanostructured shapes comprising different material(s) and/or having different shapes can be considered to provide the polarizing light emitting plate.

Preferred nanostructured shapes for the polarizing light emitting plate of a liquid crystal display comprises nanostructured shapes with a rod or rod-like structure having a long axis L as first part and further comprising a second part, whereby the long axis L of the first part and the second part are oriented in a plane P. The long axes L of the first are thereby preferably oriented parallel or substantially parallel with the transmission direction of the polarizer and the plane P is preferably oriented parallel or substantially parallel to a plane defined by the polarized light emitting plate.

According to a further aspect of the disclosure, a luminescent solar concentrator is provided. A luminescent solar concentrator is a device that uses a waveguide material comprising luminescent particles to absorb solar radiation before trapping and directing the down-converted (longer wavelength) emission to photovoltaic cells. The waveguide material generally comprises a planar material having a large surface for receiving incident solar radiation and having photovoltaic cells positioned at a short side surface of the waveguide material. The waveguide material typically comprises polymethyl methacrylate (PMMA) doped with organic dyes or quantum dots.

A solar concentrator according to the disclosure, comprises a waveguide material defining a surface for receiving incident radiation. The waveguide material comprises nanostructured shapes. The nanostructured shapes are oriented in such a way that the long axes L of the first parts of the nanostructured shapes are oriented perpendicular or substantially perpendicular to the surface that receives incident sunlight.

Any nanostructured shape described above can be considered for use in a solar concentrator. Also waveguide materials comprising different types of nanostructured shapes can be considered.

Preferred nanostructured shapes comprise a rod or rod-like structure as first part and a planar structure or three-dimensional structure as second part. Possibly, the nanostructured shapes further comprise a third part, preferably a planar structure or three-dimensional structure.

In case the second part and the third part (if present) comprise a planar structure, the planar structure is preferably oriented in a plane P, whereby the plane P and the long axis of the first part define an included angle $\beta$. The included angle $\beta$ is thereby defined as the angle between the long axis L and the projection of the long axis L on the plane S. The angle $\beta$ ranges preferably between 50 and 130 degrees, as, for example, between 60 and 120 degrees or between 80 and 100 degrees. More preferably, the angle $\beta$ ranges between 85 and 95 degrees and is, for example, 90 degrees.

BRIEF DESCRIPTION OF THE DRAWINGS

The disclosure will be discussed in more detail below, with reference to the attached drawings, in which.

DETAILED DESCRIPTION

This disclosure will be described with respect to particular embodiments and with reference to certain drawings. The drawings are only schematic and non-limiting. The size of some elements may be exaggerated and not drawn on scale for illustrative purposes. The dimensions and the relative dimensions do not correspond to actual reductions to practice of the invention.

Figure 1:
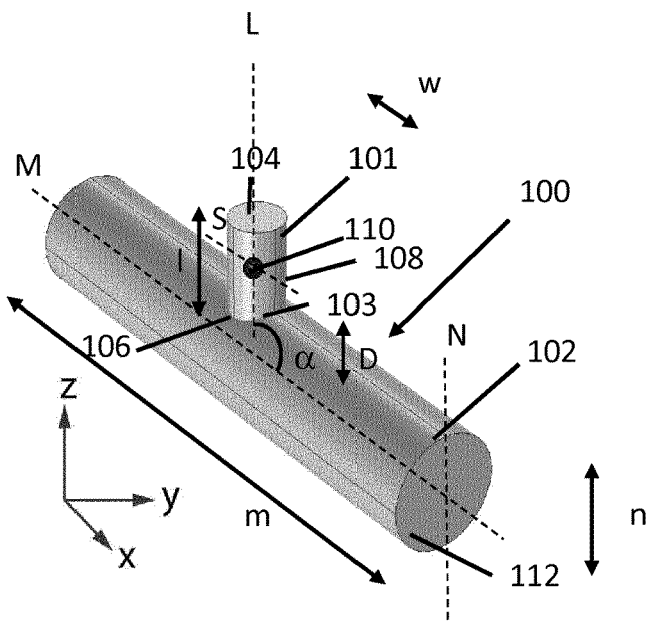
FIG. 1 depicts a first embodiment of a nanostructured shape according to the disclosure.

FIG. 1 schematically illustrates a first example of a nanostructured shape 100 according to the disclosure. The nanostructured shape 100 comprises a first part 101 comprising a CdSe quantum dot as emitting material 110 surrounded by a CdS shell as first absorbing material 108. The first part 101 has a rod-like shape with a long axis L and a short axis S. In the example shown in FIG. 1 the long axis L corresponds with the z-axis while the short axis S corresponds with the x-axis. The first part 101 has a length l measured along the long axis L and a width w measured along the short axis S. The length l is larger than the width w. More preferably, the length l is at least two times the width w, at least five times the width w or even more preferably, the length l is at least ten times the width w.

The length l is preferably less than 1 μm and ranges, for example, between 1 and 100 nm. In the embodiment shown in FIG. 1, the length l is 10 nm and the width w is less than 10 nm.

The first part 101 has a first longitudinal end 103 and a second longitudinal end 104. The second part 102 is connected in a first connection region 106 to the first longitudinal end 103 of the first part 101.

The material 110 is located at a distance D from the first connection region 106. The distance D is measured along the long axis L of the first part, from the center point (center of gravity) of the emitting material to the first connection region. The distance D corresponds, for example, with half the length l of the first part 101.

The second part 102 comprises a rod-like structure comprising CdS. The second part 102 has a long axis M and a short axis N. In the example shown in FIG. 1 the long axis M corresponds with the x-axis and the short axis N corresponds with the z-axis. The second part 102 has a length m measured along the long axis M and a width n measured along the short axis N. The length m is larger than the width m. More preferably, the length m is at least two times the width n, at least five times the width n or even more preferably, the length m is at least ten times the width n.

The length m is preferably less than 1 μm and ranges, for example, between 10 and 100 nm. In the embodiment shown in FIG. 1, the length m is 50 nm and the width n is 10 nm.

The second part 102 is oriented with respect to the first part 101 so that the long axis M of the second part 102 defines an included angle α with the long axis L of the first part 101 ranging between 60 and 120 degrees. In the example shown in FIG. 1 the included angle α is about 90 degrees. The nanostructured shape 100 shown in FIG. 1 absorbs light polarized along an axis different from the longitudinal axis L of the first part 101, i.e., along the x-axis and emits light mainly polarized along the long axis L of the first part 101, i.e., along the z-axis.

Figure 2:
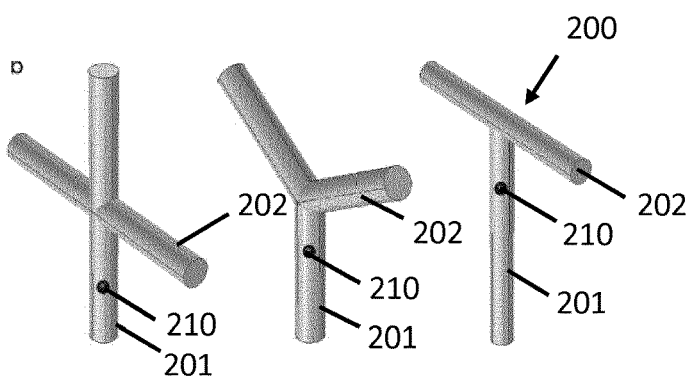
FIG. 2 depicts other embodiments of nanostructured shapes according to the disclosure having a first part and a second part with the first and the second part oriented in a plane.
Figure 2:
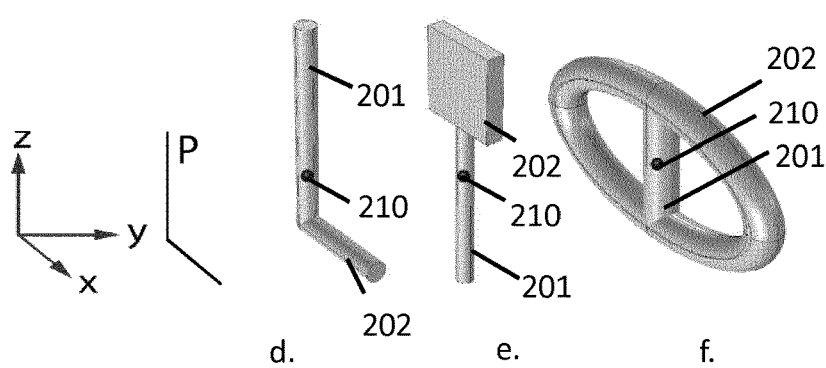

FIG. 2 depicts further embodiments of nanostructured shapes 200 according to the disclosure (FIG. 2*a* to FIG. 2*f*). The nanostructured shapes 200 comprise a first part 201 and a second part 202 whereby the first part 201 and the second part 202 are oriented in a plane P, i.e., in the xz-plane. The first part 201 comprises a rod-like structure comprising a CdSe quantum dot as emitting material 210 surrounded by a CdS Shell. The second part 202 comprises CdS.

The second part 202 comprises a multi-leg structure (FIG. 2*a*, FIG. 2*b*), a mono-leg structure (FIG. 2*c*, FIG. 2*d*), a tile shaped structure (FIG. 2*e*) or a ring-shaped structure (FIG. 2*f*).

The nanostructured shapes 200 shown in FIGS. 2*a* to 2*f* absorb light in the xz-plane and emit light polarized along the long axis L of the first part, i.e., along the z-axis.

Figure 3:
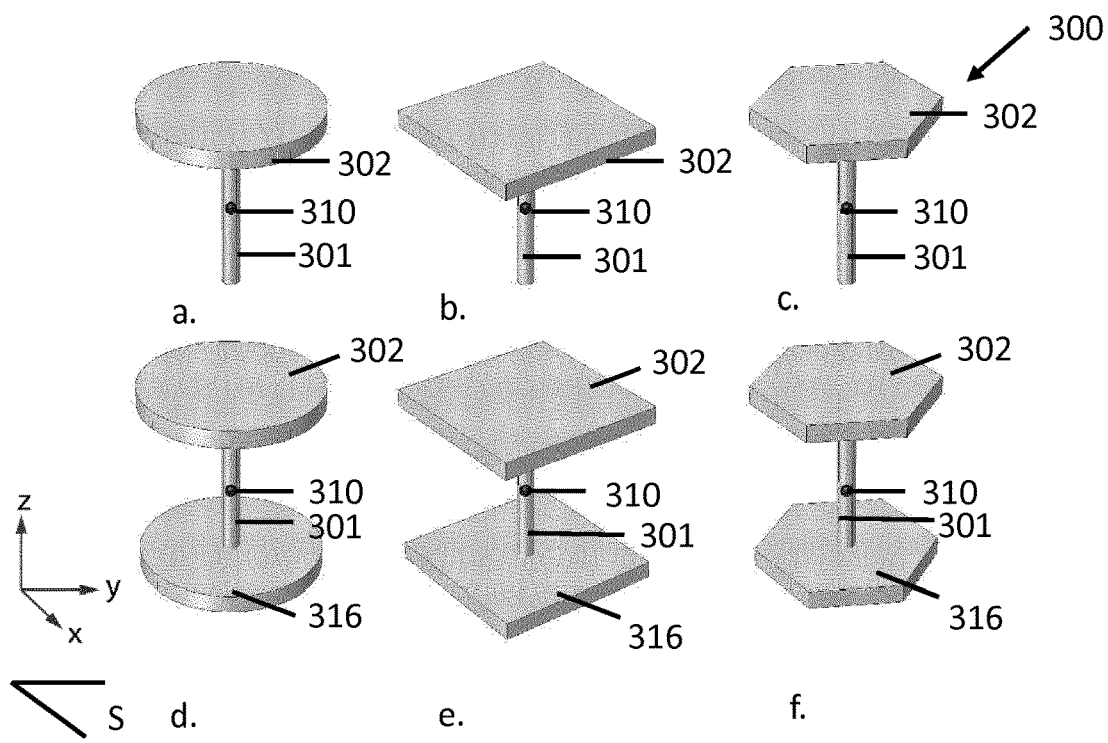
FIG. 3 depicts further embodiments of nanostructured shapes according to the disclosure having a planar structure as second part (and optionally a planar structure as third part) whereby the planar structures of the second part (and optionally of the third part) and the first part are not oriented in one plane.

FIG. 3 depicts further embodiments of nanostructured shapes 300 according to the disclosure having a rod-like structure as first part 301 and a planar structure as second part 302. The embodiments shown in FIG. 3*d* to FIG. 3*f* further comprise a planar structure as third part 316. The rod-like structure of the first part 301 has a long axis L corresponding with the z-axis. The first part 301 comprises a CdSe quantum dot as emitting material 310 surrounded by a CdS shell. The planar structure of the second part 302 and the planar structure of the third part 316 (if present) are oriented in the xy-plane. The second part 302 and the third part 316 (if present) comprise CdS.

In the examples shown in FIGS. 3*a* to 3*f* the long axis L of the first part 301 of the nanostructured shape 300 is oriented substantially perpendicular to the xy-plane (and thus substantially perpendicular to the planar structure of the second part 302 and to the planar structure of the third part 316 (if present). The included angle β between the long axis L and xy-plane (the planar structure of the second part 302 and the planar structure of the third part 316 (if present)) is thus about 90 degrees.

The planar structures of the second part 302 and the third part 316 (if present) comprise planar structures with a circular cross-section (FIG. 3a and FIG. 3d), a square cross-section (FIG. 3b and FIG. 3e) or a hexagonal cross-section (FIG. 3c and FIG. 3f).

The nanostructured shapes 300 shown in FIGS. 3a to 3f absorb light in the xy-plane and emit light polarized along the long axis L of the first part, i.e., along the z-axis.

Figure 4:
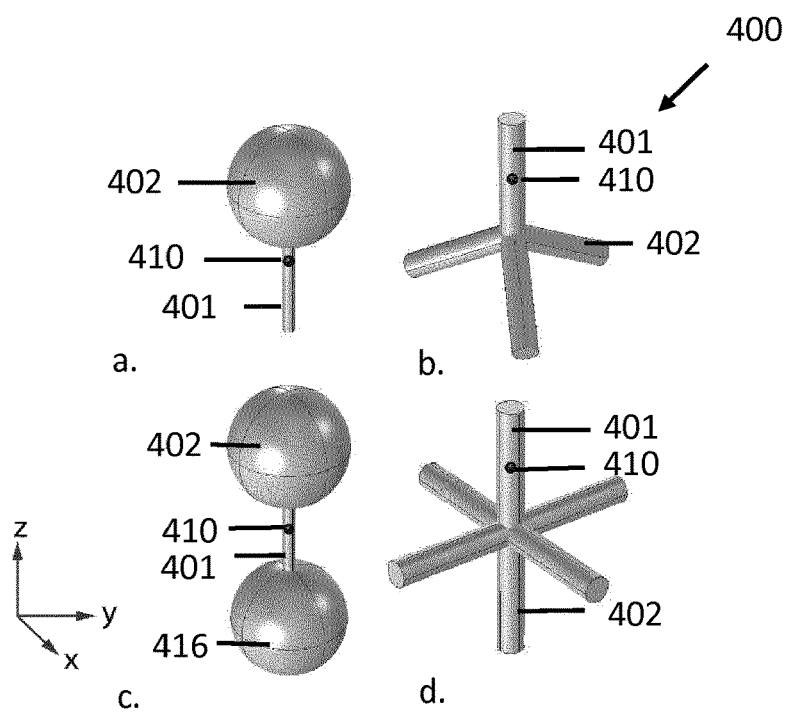
FIG. 4 depicts still further embodiments of nanostructured shapes according to the disclosure having a three-dimensional structure as second part (and optionally a three-dimensional structure as third part)

FIG. 4 depicts still further embodiments of nanostructured shapes 400 according to the disclosure (FIG. 4a to FIG. 4d). The nanostructured shapes 400 have a rod-like structure as first part 401 and a three-dimensional shaped structure as second part 402. The embodiment shown in FIG. 4c further comprises a three-dimensional structure as third part 416. The first part 401 comprises a rod-like structure comprising a CdSe quantum dot as emitting material 410 surrounded by a CdS shell. The second part 402 and the third part 416 (if present) comprise CdS.

The three-dimensional structure of the second part 402 of FIG. 4a comprises a sphere. FIG. 4c further comprises a sphere as third part 416. The three-dimensional structures of the second part 402 of FIGS. 4b and 4c comprise multi-leg structure, i.e., a structure having three legs (FIG. 4b) and a structure having 5 legs (FIG. 4d).

The nanostructured shapes 400 shown in FIGS. 4a to 4d absorb light in x, y and z-direction and emit light polarized along the long axis L of the first part, i.e., along the z-axis.

Figure 5:
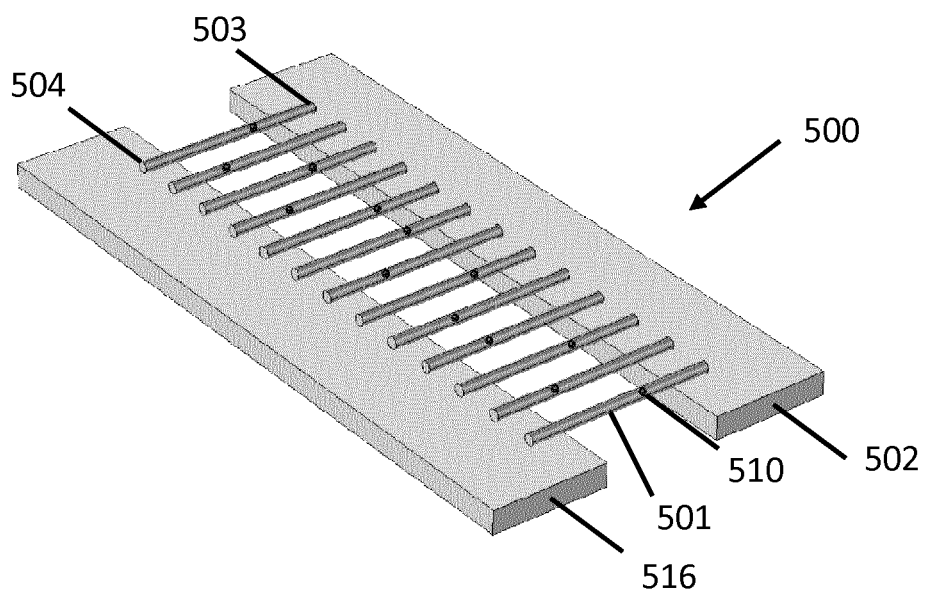
FIG. 5 depicts a further embodiment of a nanostructured shape according to the disclosure comprising a number of parallel aligned first parts.

FIG. 5 shows a further embodiment of a nanostructured shape 500 according to the disclosure. The nanostructured shape 500 comprises a plurality of aligned first parts 501 comprising a quantum dot as emitting material 510. The first parts 501 are separated from each other. The nanostructured shape 500 further comprises a second part 502 and a third part 516. The second part 502 is connected to the first longitudinal ends 503 of the first parts 501 and the second part 502 are connected to the second longitudinal ends 504 of the first parts. The second part 502 and the third part 516 are preferably oriented parallel. In the embodiment shown in FIG. 5 the second part 502 and third part 516 are mainly planar, and the length of the second part 502 and third part 516 are much longer than the length of the first parts 501.

When a single particle with real, isotropic and homogeneous dielectric constant $\varepsilon_p$ is placed in an external medium with dielectric constant $\varepsilon_m$ and homogeneous and static electric field $E_e$, the magnitude and the orientation of the electric field $E_i$ inside the particle depend on the position r. The relation between the field components inside the particle and the external field components is linear and described by a tensor $\bar{\bar{\beta}}(r)$:

$$E_i(r) = \bar{\bar{\beta}}(r)E_e = \begin{pmatrix} \beta_{xx}(r) & \beta_{xy}(r) & \beta_{xz}(r) \\ \beta_{yx}(r) & \beta_{yy}(r) & \beta_{yz}(r) \\ \beta_{zx}(r) & \beta_{zy}(r) & \beta_{zz}(r) \end{pmatrix} E_e.$$

The amplitude of the oscillating electric field $E_i(r)$ inside a particle, due to an incident plane electromagnetic wave with amplitude $E_e(r)$ can also be approximated by this tensor when absorption is weak and when the particle is much smaller than the wavelength. The absorption per unit volume in the particle is then given by $\frac{1}{2}\omega Im\ (\varepsilon_p)|E_i(r)|^2$. If the external field $E_e$ is, for example, polarized along the z-axis, then the absorption is proportional to the quadratic field factor $\beta_z^2$, with:

$$\beta_z^2(r) = \beta_{xz}^2(r) + \beta_{yz}^2(r) + \beta_{zz}^2(r).$$

The total particle absorption is proportional to the volume average of the quadratic field factor $\beta_\parallel^2$ or $\beta_\perp^2$ (for fields resp. parallel or perpendicular to the long axis). The anisotropy in the absorption cross-section of the particle for ∥ versus ⊥ polarized light is defined as $a_\sigma$:

$$a_\sigma = \frac{\int_V (\beta_\parallel^2 - \beta_\perp^2)dV}{\int_V (\beta_\parallel^2 + \beta_\perp^2)dV}.$$

Figure 6:
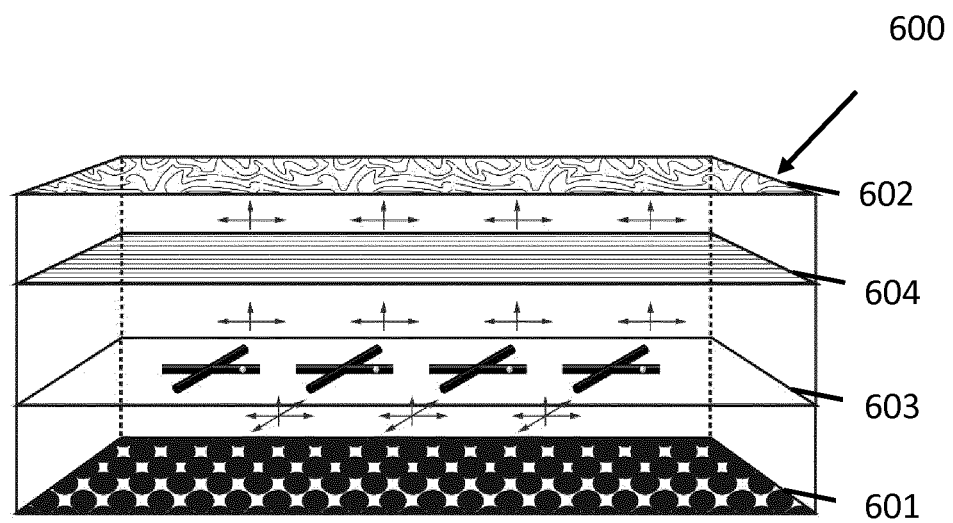
FIG. 6 shows a liquid crystal display device according to the disclosure.

FIG. 6 illustrates a liquid crystal display device 600 according to the disclosure. The liquid crystal display device 600 comprises a backlight unit 601, a liquid crystal display panel 602, a polarizing light emitting plate 603 disposed between the backlight unit 601 and the liquid crystal display panel 602 and a polarizer 604 disposed between the polarizing light emitting plate 603 and the liquid crystal display panel 602. The backlight unit preferably uses LEDs (Light Emitting Diode) as backlight source. The polarizing light emitting plate 603 comprises aligned nanostructured shapes 605.

The use of a polarizing light emitting plate comprising spherical quantum dots dispersed in a polymer layer is known in the art. The quantum dots are, for example, illuminated by blue LEDs to generate narrow-band green or red light. As the emission of the quantum dots is unpolarised, 50% of the emission light is lost in the polarizer of the liquid crystal display device.

By using a polarizing light emitting plate comprising dots-in-rods instead of quantum dots, a high degree of polarization can be obtained. However, the dots-in-rods mainly harvest blue photons with the same polarization.

By using a polarizing light emitting plated comprising aligned nanostructured shapes according to the disclosure and by aligning the nanostructured shapes in such a way that the long axes L of the first parts of the nanostructured shapes are aligned parallel or substantially parallel with the transmission direction of the polarizer, a high degree of polarization of emission can be obtained. Nanostructured shapes having a rod or rod-like structure with a long axis L as first part and further comprising a second part with the long axis L of the first part and the second part oriented in one plane are of particular importance for use in a liquid crystal display device. Such nanostructured shapes are preferably oriented with their long axes L parallel or substantially parallel with the transmission direction of the polarizer and parallel or substantially parallel to a plane defined by the polarizing light emitting plate.

A particular preferred nanostructured shape suitable for use in a liquid crystal display comprises a cross-shaped nanostructured shape as, for example, shown in FIG. 2a. The absorption and emission properties of such a nanostructured shape comprising a cross-shaped particle as shown in FIG. 2a are given in FIG. 7. The cross-shaped particles consists of two cylinders with length 2.1+w and width w. The quantum dot is positioned about half way in one of the four arms at a distance D being equal to ½ (D=½). The arm comprising the quantum dot is considered as the first part of the nanostructured shape and the other three arms are considered as the second part of the nanostructured shape.

Figure 7:
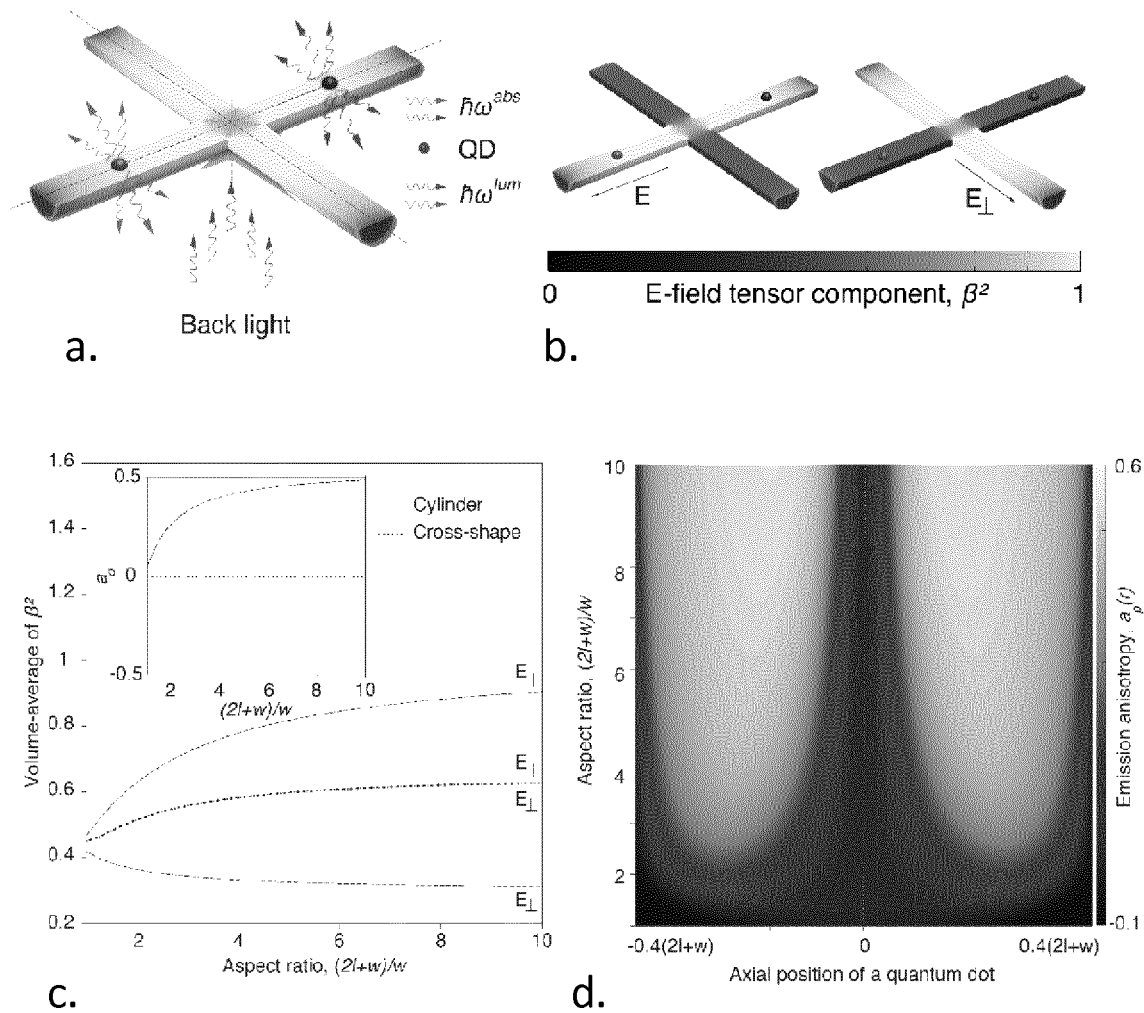
FIG. 7 shows the absorption and emission properties of a cross-shaped nanostructured shape according to the disclosure.

Both the first part and the second part are oriented in one plane. FIG. 7 shows that for such particle efficient absorption for both polarizations and highly polarized emission can be obtained. FIG. 7a shows the photoluminescence of the cross-shaped particle. FIG. 7b shows the orientation-dependent square field parameter $\beta^2$ of the cross-shaped particle. FIG. 7c shows the volume average of $\beta^2$ and absorption anisotropy $a_\sigma$ (inset) as a function of the aspect ratio l/w. FIG. 7d shows the emission anisotropy $a_p$ for the cross-shaped particle in function of the aspect ratio (2l+w)/w and the axial position D+w/2 of a quantum dot.

For a cross-shaped particle with quantum dot in position r, the fraction of the emitted light that is transmitted by an ideal polarizer in the perpendicular direction is given by:

$$T_{pol} = \frac{\beta_\parallel^2(r)}{\beta_\parallel^2(r) + \beta_\perp^2(r)} = \frac{1 + a_p}{2}.$$

An additional advantage of a cross-shaped quantum dot compared to a spherical quantum dot is that the relative emission in the vertical direction for the cross-shaped particle is higher than for a spherical quantum dot, i.e., higher by a factor:

$$\frac{I_{cross}}{I_{QD}} = \frac{3}{2} \frac{\beta_\parallel^2(r) + \beta_\perp^2(r)}{\beta_\parallel^2(r) + \beta_\perp^2(r) + \beta_z^2(r)}.$$

Figure 8:
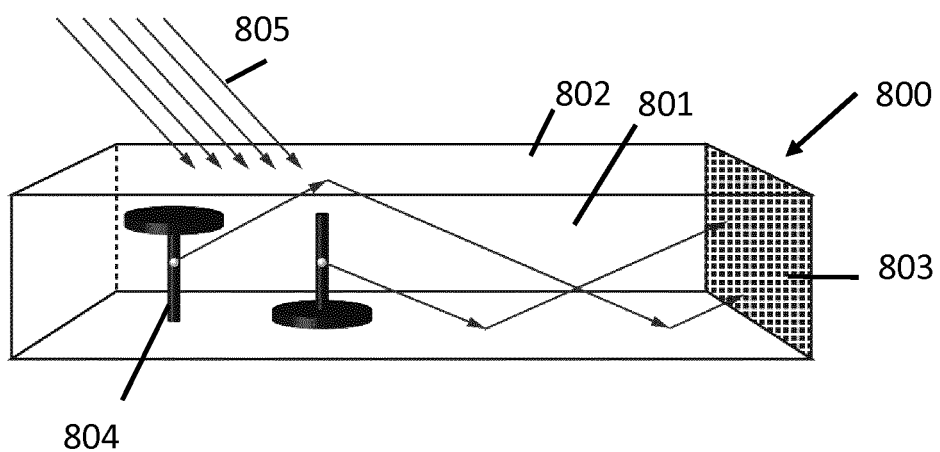
FIG. 8 shows a solar concentrator according to the disclosure.

FIG. 8 illustrates a solar concentrator 800 according to the disclosure. The solar concentrator 800 comprises a waveguide material 801 comprising nanostructured shapes 804. The waveguide material 801 comprises a planar structure having a top surface 802 for receiving incident radiation, in particular, solar radiation 805 and has a side surface 803. Usually, the side surface 803 is smaller than the top surface 802. The solar radiation 805 is absorbed by the nanostructured shapes 804 and the emitted light is trapped within the waveguide material 801 and guided to the photovoltaic cells positioned at a short side surface 803 of the waveguide material 801.

Preferably, the nanostructured shapes 804 should efficiently absorb externally incident light and have most of the photoluminescence guided by total internal reflection.

By using nanostructured shapes 804 aligned with their long axis L perpendicular or substantially perpendicular to the surface 802 for receiving solar radiation high degree of polarization of emission can be obtained.

Nanostructured shapes 804 having a rod or rod-like structure having a long axis L as first part and further comprising a planar structure as second part, whereby the first part and the second part are not oriented in a plane are of particular importance.

A particularly preferred nanostructured shape 804 suitable for use in a solar concentrator comprises a flat-headed thumbtack particle as shown in FIG. 3a. Such flat-headed thumbtack particle comprises a rod-like structure (with length l and width w) as first part comprising a quantum dot located about half way in the rod-like structure and a head structure (with length m (=diameter of the head structure) and width n (=thickness of the head structure)) as second part. The rod-like structure is preferably oriented with its long axis perpendicular to the surface 802 for receiving solar radiation. The head is preferably oriented parallel to the surface 802 for receiving solar radiation.

Figure 9:
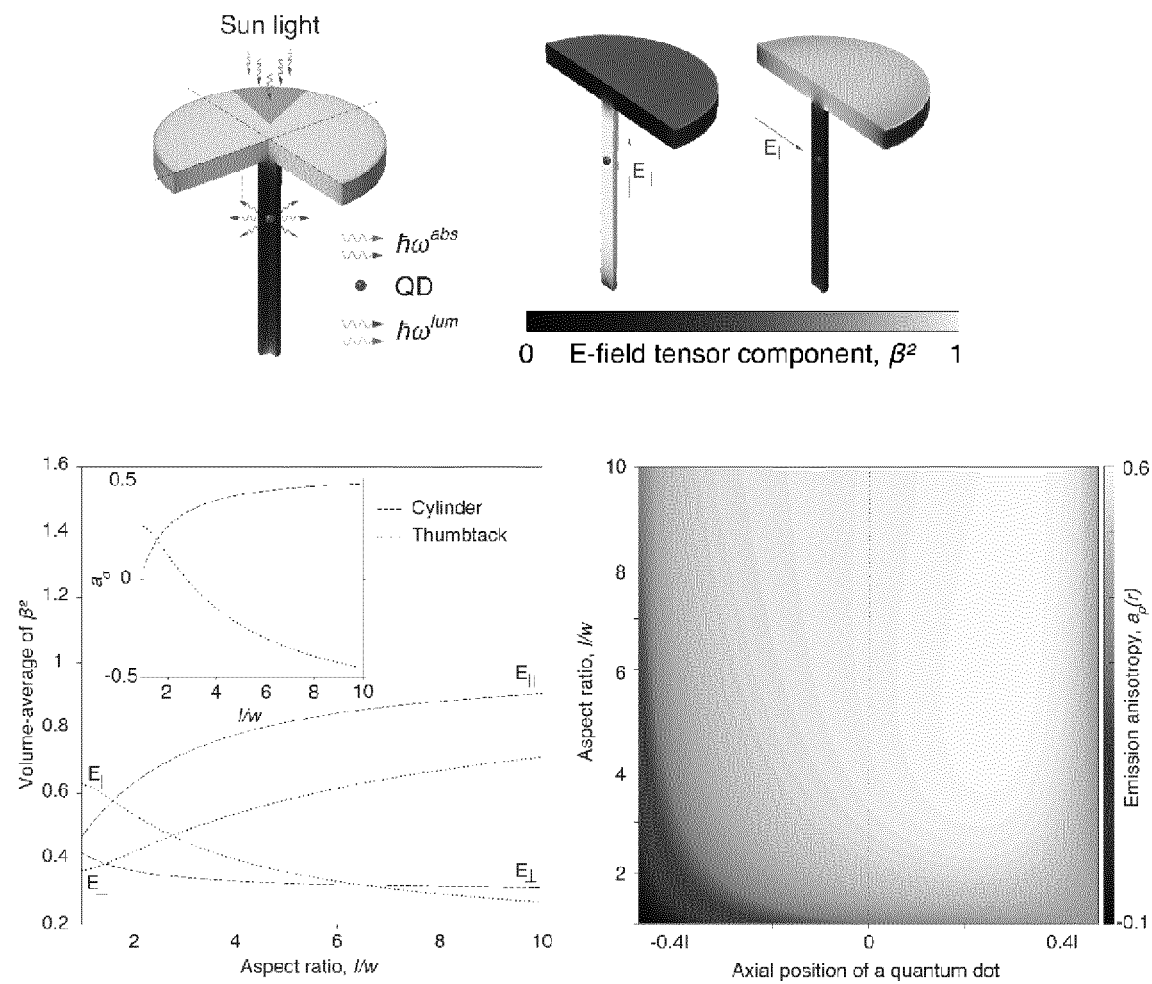
FIG. 9 shows the absorption and emission properties of a flat-headed thumbtack nanostructured shape according to the disclosure.

The absorption and emission properties of such a nanostructured shape 804 comprising a flat-headed thumbtack particle as shown in FIG. 3a are given in FIG. 9. FIG. 9a shows the photoluminescence of the flat-headed thumbtack particle. FIG. 9b shows the orientation dependent square field parameter $\beta^2$ of the flat-headed thumbtack particle. FIG. 9c shows the volume average of $\beta^2$ and absorption anisotropy $a_\sigma$ (inset) as a function of the aspect ratio l/w. FIG. 9d shows the emission anisotropy $a_p$ for the flat-headed thumbtack particle.

The large volume of the particle head (the second part) enables efficient absorption of the incident sunlight for both polarizations while the rod-like structure (the first part) comprising the quantum dot promotes the emission in the plane parallel to the head.

Inside the waveguide material, incident sunlight propagates within a cone with half-angle corresponding to total internal reflection: $\theta_{TIR}=\arcsin(1/n_m)=42°$ for $n_m=1.5$. The average absorption cross-section of the thumbtack particle for unpolarized light, incident within this solid angle ($\theta<\theta_{TIR}$), is larger than the average absorption cross-section of the same particle for light with random direction of incidence, by a factor $F_{absorption}$:

$$F_{absorption} = \frac{\sigma_{avg,TIR}}{\sigma_{avg,4\pi}} = \frac{3 - 3\cos\theta_{TIR} - a_\sigma + a_\sigma\cos^3\theta_{TIR}}{(3 - a_\sigma)(1 - \cos\theta_{TIR})}.$$

This factor is highest (and the absorption is most efficiently) when the absorption anisotropy $a_\sigma$ is minimal. For a thumbtack particle with large aspect ratio, the absorption anisotropy becomes $a_\sigma^{min}=-0.75$, which results in $F_{absorption}=1.26$. For the emission of a particle with symmetry axis oriented perpendicular to the substrate, the fraction of waveguided light in the substrate (with $\theta_{TIR}<\theta<\pi-\theta_{TIR}$) can be calculated as $$\eta_{waveguided} = \frac{3\cos\theta_{TIR} - a_p(r)\cos^3\theta_{TIR}}{3 - a_p(r)}.$$

This factor is highest when the emission anisotropy $a_p(r)$ is maximal, which for the thumbtack particle is obtained with l/w=6 and the quantum dot at 0.25 l ($a_p^{max}=0.60$), yielding $\eta_{waveguided}=0.83$.

Figure 10:
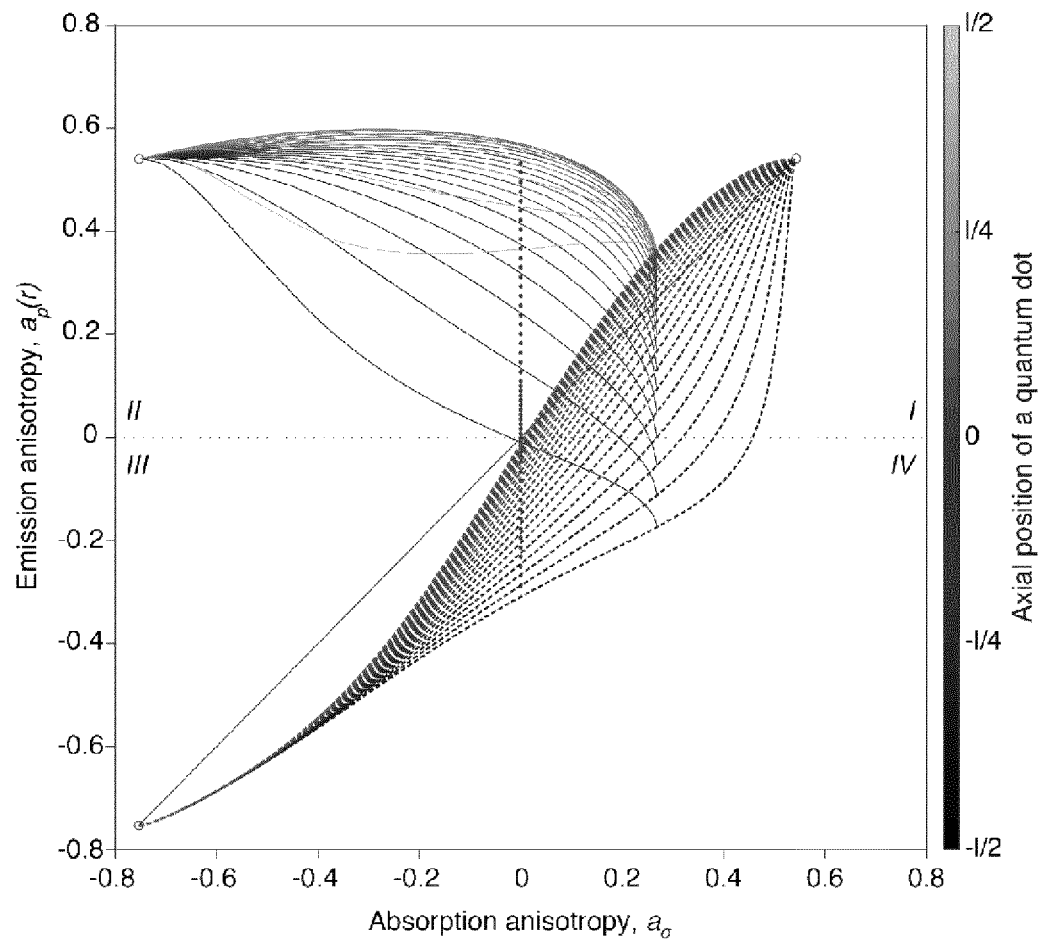
FIG. 10 shows the emission anisotropy versus absorption anisotropy of some nanostructured shapes.

The diagram shown in FIG. 10 encompasses the influence of the aspect ratio and the axial position of the quantum dot on the absorption and emission anisotropy for different particles: a sphere, ellipsoids, cylinders, thumbtacks and cross-shape particles. Different curves represent different axial positions of the quantum dot. The absorption and emission anisotropies are the same for ellipsoidal particles (bisector line, quadrants I and III); and the cross-shape particle has zero absorption anisotropy.

For the ellipsoidal particle (solid diagonal line) only the aspect ratio matters (disc for l/w<1, sphere for l/w=1 in (0,0) and rod for l/w>1).

For the cross-shape particle (dotted lines) the absorption anisotropy is zero.

For the cylindrical particles (dashed lines) and thumbtack particles (solid lines), each curve represents a different axial position of the quantum dot, while the aspect ratio varies along the curve as indicated by the arrows. For the solar concentrator application, a negative anisotropy in absorption and a positive anisotropy in emission is preferred, which means the nanostructured shapes with anisotropy situated in the second quadrant of FIG. 10.

Figure 11:
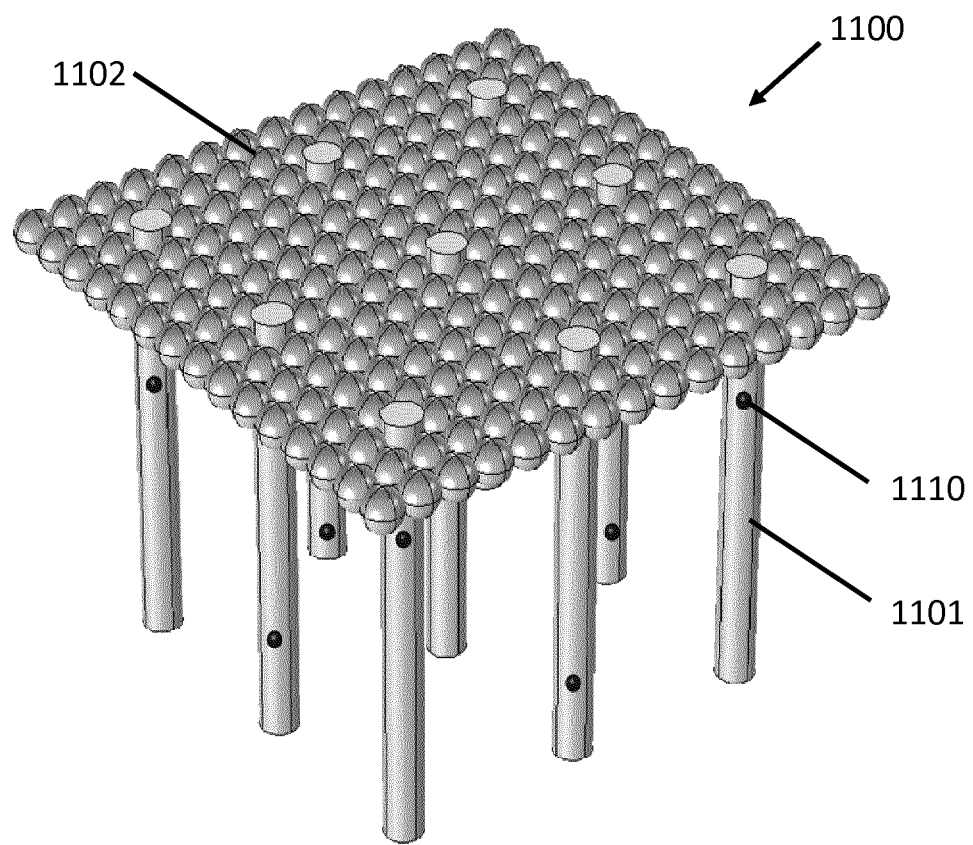
FIG. 11 shows a further embodiment of a thumbtack-like nanostructured shape according to the disclosure comprising a number of parallel aligned first parts.

FIG. 11 shows a further embodiment of a nanostructured shape 1100 according to the disclosure. The thumbtack-like nanostructured shape 1100 comprises a plurality of aligned first parts 1101. Each of the first parts 1101 comprise a quantum dot 1110 as emitting material. The quantum dot 1110 is surrounded by a semiconductor material. Preferably, the quantum dot 1110 is completely surrounded by the semiconductor material. The nanostructured shape 1100 further comprises a second part 1102. The second part 1102 comprises, for example, a planar structure, for example, oriented perpendicular or substantially perpendicular to the parallel oriented first parts 1101.

The thumbtack-like nanostructured shape 1100 is, for example, synthesized by the following method:

First a plurality of nanowires 1101 is dispersed in a monomer solution. Each nanowire 1101 comprises a quantum. The nanowires 1101 comprise a quantum dot 1110 surrounded by semiconductor material. The nanowires 1101 have, for example, an aspect ratio of at least 10.

By application of an external electric field the nanowires 1101 comprising the quantum dots are aligned (for example vertically aligned) between a first and a second electrode, for example, between a top and a bottom electrode.

In a subsequent step, the monomer is polymerized, for example, by irradiating the monomer solution with UV radiation or by heating the monomer solution. It can be preferred to add a curing agent such as a UV curing agent or a thermal curing agent to the monomer solution. The polymerization steps results in a polymerized matrix comprising the parallel oriented nanowires comprising the quantum dots.

Subsequently, the matrix material is selectively etched away from one side of the polymerized matrix, for example from the top side of the polymerized matrix, until part of the nanowires 1101 are projecting or sticking out of the surface of the remaining polymer material.

In a next step a layer 1102 comprising a semiconductor material is deposited on the resulting surface of the remaining polymer material. This layer 1102 may, for example, comprise nanoparticles, for example, (spherical) nanoparticles of the same or a similar material as the nanowire shell. The nanoparticles of the layer 1102 are preferably in contact with each other and in contact with the nanowires 1101. The layer of the nanoparticles can, for example, be deposited by spin-coating or by Langmuir-Blodgett film deposition. Alternative methods to deposit a layer 1102 of a semiconductor layer on the remaining polymer material can be considered as well. Examples of alternative methods to deposit a thin film of a semiconductor material comprise thermal evaporation or chemical vapour deposition. Optionally, the remaining polymer material is etched away after the deposition of the semiconductor layer.

The invention claimed is:

1. A nanostructured shape comprising at least a first part and a second part, the first part having an elongated shape with a long axis L and a short axis S, a length l measured along the long axis L, a width w measured along the short axis S, with the length l being larger than the width w and with the length l being smaller than 1 μm, the first part having a first longitudinal end and a second longitudinal end, the first part comprising a first absorbing material and an emitting material, the emitting material being surrounded by the first absorbing material, the second part comprising a second absorbing material, each of the emitting material, the first absorbing material and the second absorbing material comprising a semiconductor material having a bandgap, with the bandgap of the first absorbing material being larger than the bandgap of the emitting material and with the bandgap of the second absorbing material being at least as large as the bandgap of the first absorbing material, the second part being connected to the first longitudinal end of the first part in a first connection region, wherein the second part mainly absorbs light with direction of polarization other than the long axis L of the first part or mainly absorbs light in a combination of directions of polarization, each of the directions of polarization being different from the long axis L and the nanostructured shape emits light mainly polarized along the long axis L of the first part.

2. The nanostructured shape according to claim 1, wherein the emitting material is positioned along the long axis L of the first part at a distance D from the first connection region, the distance D ranging between the width w and the length l minus the width w.

3. The nanostructured shape according to claim 1, wherein the emitting material comprises an organic or inorganic dipole emitter or a quantum dot.

4. The nanostructured shape of claim 1, wherein the first absorbing material and the second absorbing material comprise the same material and/or wherein the first absorbing material and the second absorbing material have substantially the same bandgap.

5. The nanostructured shape of claim 1, wherein the second part has an elongated shape with a long axis M and a short axis N, a length m measured along the long axis M, a width n measured along the short axis N, with the length m being larger than the width n, the long axis M of the second part defining an included angle α with the long axis L of the first part, the included angle α ranging between 60 and 120 degrees.

6. The nanostructured shape of claim 1, wherein the second part and the long axis L of the first part are situated in a plane P.

7. The nanostructured shape of claim 1, wherein the second part comprises a substantially planar structure oriented in a plane S, the plane S and the long axis L defining an included angle β, the included angle β being defined as the angle between the long axis L and the projection of the long axis L on the plane S, the angle β ranging between 50 and 130 degrees.

8. The nanostructured shape of claim 1, wherein the second part comprises a three-dimensional structure.

9. The nanostructured shape of claim 1, wherein the nanostructured shape further comprises a third part, the third part comprising a third absorbing material, the third absorbing material) having a bandgap being at least as large as the bandgap of the first absorbing material.

10. The nanostructured shape of claim 1, the nanostructured shape comprising n first parts, a second part and optionally a third part, with n being at least 2, the n first parts being aligned with their long axis L parallel or substantially parallel, the second part being connected to the first longitudinal ends of then first parts and the third part if present being connected to the second longitudinal ends of the n first parts.

11. An assembly of nanostructured shapes, comprising a plurality of the nanostructured shapes of claim 1, wherein the nanostructured shapes are aligned with the long axis L of the first part aligned in a predetermined direction.

12. A method for synthesizing the nanostructured shape of claim 1, the method comprising:
- providing at least one first part comprising a first absorbing material and an emitting material, the emitting material being surrounded by the first absorbing material;
- providing a second part comprising a second absorbing material;
- optionally providing a third part comprising a third absorbing material;
- joining the second part to the first part; and
- optionally joining the third part to the first part.

13. A method for synthesizing the nanostructured shape of claim 1, the method comprising:
- providing at least one first part comprising a first absorbing material and an emitting material, the emitting material being surrounded by the first absorbing material;
- depositing or growing a second part comprising a second absorbing material on the first part; and
- optionally depositing or growing a third part comprising a third absorbing material on the first part.

14. A polarizing light emitting plate comprising an assembly of the nanostructured shapes of claim 1, the polarizing light emitting plate having a desired direction of light emission, wherein the long axis L of the first part is parallel or substantially parallel to the desired direction of light emission.

15. A liquid crystal display device comprising:
- a backlight unit;
- a liquid crystal display panel disposed above the backlight unit;
- a polarizing light emitting plate comprising an assembly of a plurality of the nanostructured shapes of claim 1, the polarizing light emitting plate being disposed between the backlight unit and the liquid crystal display panel; and
- a polarizer having a transmission direction, the polarizer being disposed between the polarizing light emitting plate and the liquid crystal display panel or being attached to the liquid crystal display panel;
- wherein the long axis L of the first parts of the nanostructured shapes of the assembly of nanostructured shapes are oriented parallel or substantially parallel with the transmission direction.

16. A solar concentrator comprising:
- a waveguide material, the waveguide material defining a surface for receiving incident radiation, the waveguide material comprising a plurality of the nanostructured shapes of claim 1, the nanostructured shapes being oriented in such a way that the long axis L of the first parts of the nanostructured shapes are oriented perpendicularly or substantially perpendicularly to the surface for receiving incident radiation.

* * * * *